United States Patent
Xiang (10) Patent No.: US 6,897,122 B1
(45) Date of Patent: May 24, 2005

(54) WIDE NECK SHALLOW TRENCH ISOLATION REGION TO PREVENT STRAIN RELAXATION AT SHALLOW TRENCH ISOLATION REGION EDGES

(75) Inventor: Qi Xiang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/747,205

(22) Filed: Dec. 30, 2003

Related U.S. Application Data (62) Division of application No. 10/314,326, filed on Dec. 9, 2002, now Pat. No. 6,696,348.

(51) Int. Cl.[7] .............................................. H01L 21/76
(52) U.S. Cl. ........................ 438/424; 438/427; 438/585
(58) Field of Search ................................. 438/424, 427, 438/430, 445, 426, 585

(56) References Cited

U.S. PATENT DOCUMENTS

| | | | |
|---|---|---|---|
| 6,355,538 B1 | 3/2002 | Tseng | |
| 6,787,423 B1 * | 9/2004 | Xiang | ........................ 438/296 |
| 6,828,248 B1 * | 12/2004 | Tao et al. | ................... 438/711 |
| 2003/0049893 A1 | 3/2003 | Currie et al. | |

* cited by examiner

*Primary Examiner*—Jack Chen

(57) ABSTRACT

The present invention enables the production of improved high-speed semiconductor devices. The present invention provides the higher speed offered by strained silicon technology coupled with the smaller overall device size provided by shallow trench isolation technology without relaxation of the portion of the strained silicon layer adjacent to a shallow trench isolation region by laterally extending a shallow trench isolation into the strained silicon layer overlying a silicon germanium layer.

13 Claims, 9 Drawing Sheets

WIDE NECK SHALLOW TRENCH ISOLATION REGION TO PREVENT STRAIN RELAXATION AT SHALLOW TRENCH ISOLATION REGION EDGES

This application is a divisional of application Ser. No. 10/314,326 filed Dec. 9, 2002, now U.S. Pat. No. 6,696,348.

FIELD OF THE INVENTION

The present invention relates to the manufacturing of semiconductor devices, and more particularly, to forming strained-silicon devices with improved electrical characteristics.

BACKGROUND OF OF THE INVENTION

An important aim of ongoing research in the semiconductor industry is increasing semiconductor performance while decreasing power consumption in semiconductor devices. Planar transistors, such as metal oxide semiconductor field effect transistors (MOSFET) are particularly well suited for use in high-density integrated circuits. As the size of MOSFET and other devices decrease, the dimensions of source/drain regions, channel regions, and gate electrodes of the devices, also decrease.

Strained silicon transistors provide increased semiconductor performance with decreased power consumption. Strained silicon transistors are created by depositing a layer of silicon germanium (SiGe) on a bulk silicon wafer. A thin layer of silicon is subsequently deposited on the SiGe layer. The distance between atoms in a SiGe crystal lattice is greater than the distance between atoms in an ordinary silicon crystal lattice. There is a natural tendency of atoms inside different types of crystals to align with one another where one crystal is formed on another crystal. As such, when a crystal lattice of silicon if formed on top of a layer of SiGe, the atoms in the silicon crystal lattice stretch or "strain" to align with atoms in the SiGe lattice. A resulting advantage of such feature is that the strained silicon experiences less resistance to electron flow and produces gains of up to 80% in speed as compared to ordinary crystalline silicon.

Shallow trench isolation (STI) provides another technique to shrink device size. The use of STI significantly shrinks the area needed to isolate transistors better than local oxidation of silicon (LOCOS). STI also provides superior latch-up immunity, smaller channel width encroachment, and better planarity. The use of STI techniques eliminates the bird's-beak frequently encountered with LOCOS.

Strained silicon layers are typically epitaxial layers formed by chemical vapor deposition (CVD) to a thickness of about 100 Å to about 300 Å. The thickness of the strained silicon layer depends on the Ge concentration in the SiGe layer. The critical thickness of a strained silicon layer is the maximum thickness below which the strained silicon is defect free. At thicknesses above the critical thickness, the strained silicon layer tends to relax, the crystalline geometry of the relaxed region becoming more like ordinary crystalline silicon and less like a SiGe crystal. When the Ge concentration in the SiGe layer is about 15%, the critical thickness of the strained silicon layer is about 300 Å. When the Ge concentration in the SiGe layer is about 20%, the critical thickness of the strained silicon layer is about 200 Å. When the Ge concentration in the SiGe layer is about 30%, the critical thickness of the strained silicon layer is about 100 Å.

Figure 1:
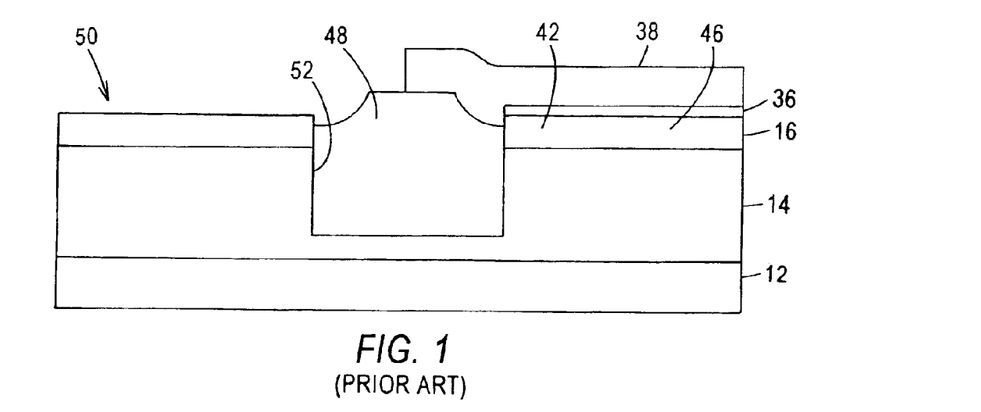
FIG. 1 schematically illustrates a conventional silicon semiconductor device comprising a strained silicon layer and a shallow trench isolation region.

Strained silicon layers also tend to relax in the portion of a strained silicon layer adjacent to the boundary of a strained silicon layer and an STI region trench sidewall. A semiconductor device 50 as shown in FIG. 1, comprises a strained silicon layer 16 formed overlying a SiGe layer 14 on a silicon-containing substrate 12. An STI region 48 with a trench sidewall 52 borders the strained silicon layer 16 and the SiGe layer 14. A gate oxide layer 36 and polysilicon gate electrode layer 38 are formed overlying the strained silicon layer 16. The portion of the strained silicon layer 42 adjacent STI region trench sidewall 52 tends to relax, becoming more like ordinary crystalline silicon. As a result of strained silicon relaxation, electrons move slower through the portion of the strained silicon region adjacent a STI region 42 than through the remaining portion of the strained silicon layer not adjacent to the STI region 46.

The term semiconductor devices, as used herein, is not to be limited to the specifically disclosed embodiments. Semiconductor devices, as used herein, include a wide variety of electronic devices including flip chips, flip chip/package assemblies, transistors, capacitors, microprocessors, random access memories, etc. In general, semiconductor devices refer to any electrical device comprising semiconductors.

SUMMARY OF THE INVENTION

There exists a need in the semiconductor device art for a device that combines the performance improvements of strained silicon technology and STI technology. There exists a need in this art to produce a semiconductor device without relaxation of the portion of the strained silicon layer adjacent to a STI region trench sidewall.

These needs are met by a semiconductor device comprising a silicon-containing substrate with a silicon germanium (SiGe) layer formed on the silicon-containing substrate. A strained silicon layer is formed on the SiGe layer. A trench isolation region is formed extending into the strained silicon layer and the SiGe layer, wherein the portion of the isolation region in the strained silicon layer has a greater width than the portion of the isolation region in the SiGe layer.

The earlier stated needs are also met by a method of forming a semiconductor device comprising forming a SiGe layer on a silicon-containing semiconductor substrate. A silicon layer is formed over the SiGe layer. A layer of a first insulating material is formed on the SiGe layer and a layer of a second insulating material is formed on the first insulating material layer. A trench of a first width is formed in the layer of first insulating material and the layer of the second insulating material. The trench is extended into the silicon layer in both the lateral and vertical directions, so that the trench undercuts the layer of first insulating material. The trench formed in the first and second insulating layers is further extended into the SiGe layer such that a portion of the trench extending into the SiGe layer has substantially the same width as the first width. The trench is filled with an insulating material.

The earlier stated needs are further met by a method of forming a semiconductor device comprising forming a SiGe layer on a silicon-containing semiconductor substrate. A silicon layer is formed over the SiGe layer. A trench of a first width is formed in the silicon layer exposing the SiGe layer. An opening is formed in the SiGe layer in the trench, wherein the opening has a second width that is less than the first width. The opening and the trench are filled with an insulating material to form an isolation region.

This invention addresses the needs for an improved high-speed semiconductor device comprising strained silicon technology and STI technology without relaxation of the portion of the strained silicon layer adjacent the STI region.

The foregoing and other features, aspects, and advantages of the present invention will become apparent in the following detailed description of the present invention when taken in conjunction with the accompanying drawings.

BRIEF DESCRIPTION OF THE DRAWINGS

The following detailed description of the embodiments of the present invention can best be understood when read in conjunction with the following drawings, in which the various features are not necessarily drawn to scale but rather are drawn as to best illustrate the pertinent features, in which like reference numerals are employed throughout to designate similar features, wherein.

DETAILED DESCRIPTION OF THE INVENTION

The present invention enables the production of improved high-speed semiconductor devices. The present invention further provides the higher speed offered by strained silicon technology coupled with the smaller overall device size provided by STI technology. The present invention provides strained silicon semiconductor devices without relaxation of the portion of the strained silicon layer adjacent to the STI region trench sidewall.

The invention will be described in conjunction with the formation of the semiconductor device illustrated in the accompanying drawings. However, this is exemplary only as the claimed invention is not limited to the formation of the specific device illustrated in the drawings.

Figure 2:
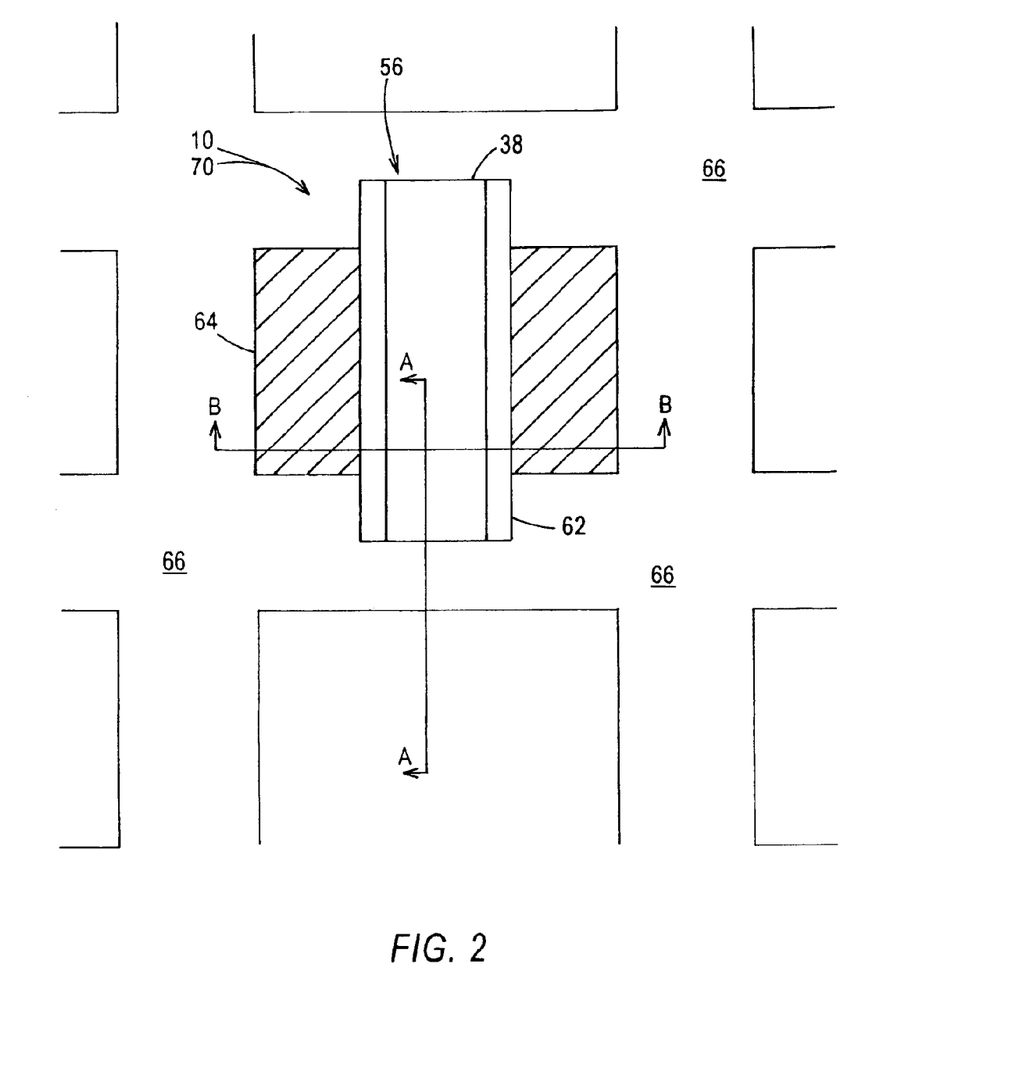
FIG. 2 is a plan view of a semiconductor device formed according to the instant invention.

FIG. 2 is a plan view of a semiconductor device 10, 70 formed in accordance with the instant invention. In this embodiment the semiconductor device 10, 70 is a transistor 56 surrounded by shallow trench isolation regions 66. The illustrated components of the transistor 56 include a gate electrode 38, spacer sidewalls 62, and source/drain regions 64.

Figure 3:
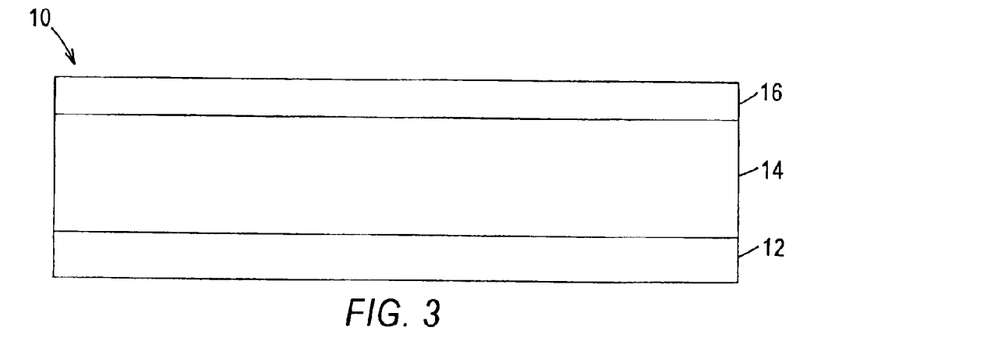
FIGS. 3-14 schematically illustrate a method of forming a semiconductor device comprising a strained silicon region and a STI region that laterally extends into the strained silicon layer according to an embodiment of the invention.

A semiconductor device 10 is formed via the following steps in accordance with one embodiment of the instant invention. FIG. 3-13, are sectional views taken along line AA of FIG. 2 showing the formation of semiconductor device 10. A semiconductor substrate 12 is provided, as shown in FIG. 3. Semiconductor device 10 comprises a substrate layer 12, such as a silicon-containing wafer, with a SiGe layer 14 formed thereon. A layer of strained silicon 16 is formed over the SiGe layer 14. Substrate layer 12 is typically a silicon wafer about 100 $\mu$m thick. The SiGe layer 14 is formed by a chemical vapor deposition (CVD) process, such as ultra-high vacuum chemical vapor deposition (UHVCVD). The concentration of Ge in the SiGe layer 14 is from about 15 atomic % Ge up to about 30 atomic % Ge. In certain embodiments, the SiGe layer 14 comprises a concentration of Ge which is graded from about 0 atomic % Ge at the SiGe layer 14/substrate layer 12 interface, increasing as the SiGe layer 14 is deposited up concentration of about 30 atomic % Ge.

The strained silicon layer 16 is formed to a thickness of about 100 Å to about 300 Å, depending on the Ge concentration in the SiGe layer 14. The maximum thickness of the strained silicon layer 16 is usually its critical thickness. When the Ge concentration in the SiGe layer 14 is about 15 atomic %, the critical thickness of the strained silicon layer 16 is about 300 Å. When the Ge concentration in the SiGe layer 14 is about 20 atomic %, the critical thickness of the strained silicon layer 16 is about 200 Å. When the Ge concentration in the SiGe layer 14 is about 30 atomic %, the critical thickness of the strained silicon layer 16 is about 100 Å.

Figure 4:
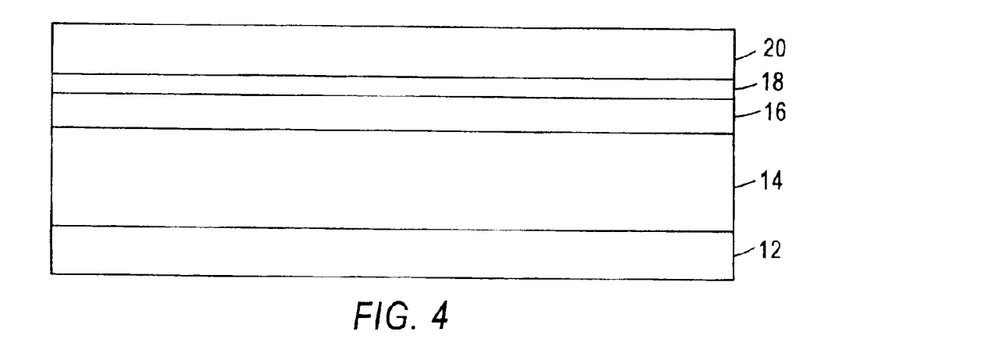

A silicon oxide layer 18 and silicon nitride layer 20 are subsequently formed over the strained silicon layer 16, as shown in FIG. 4. The silicon oxide layer 18 is about 100 Å to about 200 Å thick and the silicon nitride layer 20 is about 1000 Å to about 2000 Å thick. The oxide 18 and nitride 20 layers can be formed by conventional means, such as by CVD.

Figure 5:
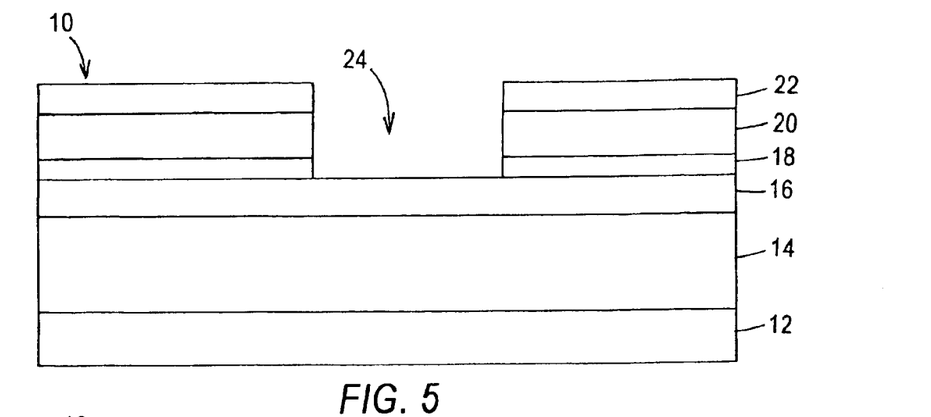
Figure 6:
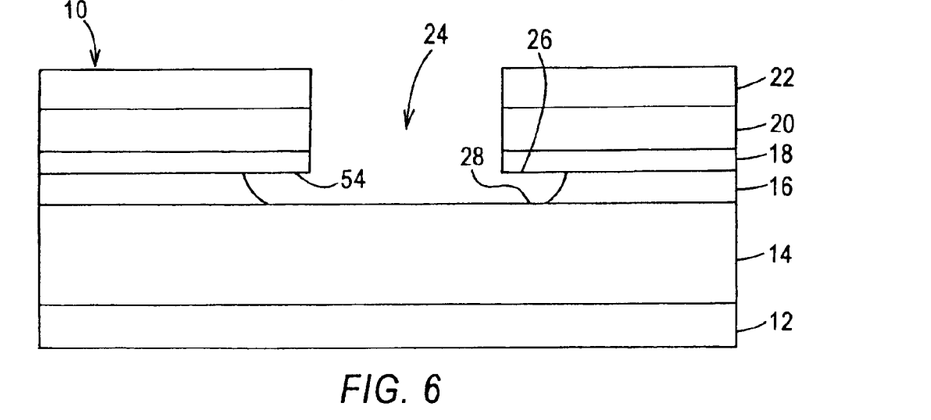

A resist layer 22 comprising a conventional photoresist is formed over the nitride layer 22, and patterned using conventional photolithographic techniques, such as selective exposure to actinic radiation and subsequent development. Anisotropic etch, such as a plasma etch, is performed to transfer the pattern in the photoresist into the nitride layer 20 and oxide layer 18 to form trench 24, as shown in FIG. 5. An isotropic etch is then performed on the strained silicon layer 16 to laterally extend the trench 24 into the strained silicon layer, as shown in FIG. 6. The isotropic etching forms an undercut 54 undercutting the edge portion 26 of the oxide layer 18 and exposing an edge portion of the upper surface 28 of the SiGe layer 14. The isotropic etch can be performed by a plasma barrel etch or by a wet etchant, such as an aqueous solution of nitric acid ($HNO_3$) and hydrofluoric acid (HF). In certain embodiments of the instant invention, the silicon wet etchant comprises 50 parts $HNO_3$, 3 parts HF, and 20 parts $H_2O$.

Figure 7:
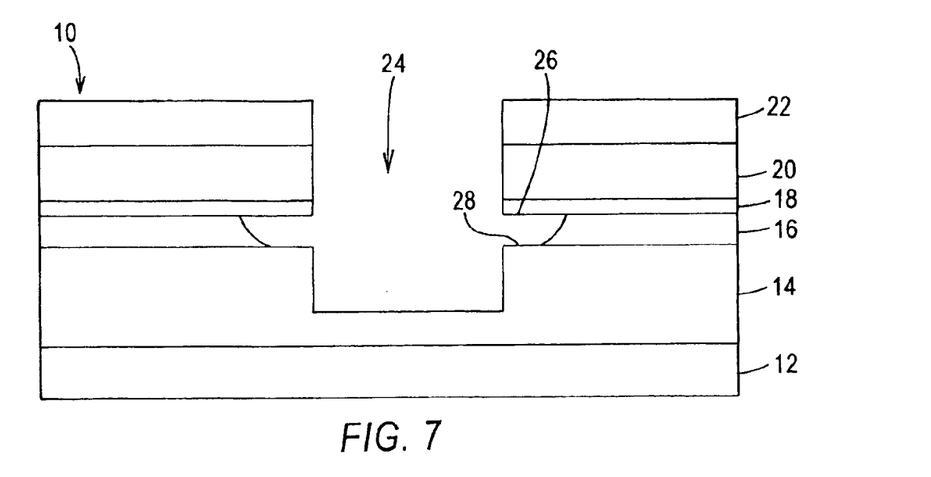

As shown in FIG. 7, after undercutting a desired length of the edge portion 26 of the oxide layer 18, the SiGe layer 14 is anisotropically etched to extend the trench 24 into the SiGe layer 14. The trench 24 is vertically extended into the SiGe layer 14 to enlarge the trench 24 to a depth of about 1000 Å to about 6000 Å. The anisotropic etch is performed using conventional techniques, such as plasma etching. The plurality of anisotropic etch steps can be carried out in a series of plasma etching steps using different known plasmas that optimally etch the various different layers.

Figure 8:
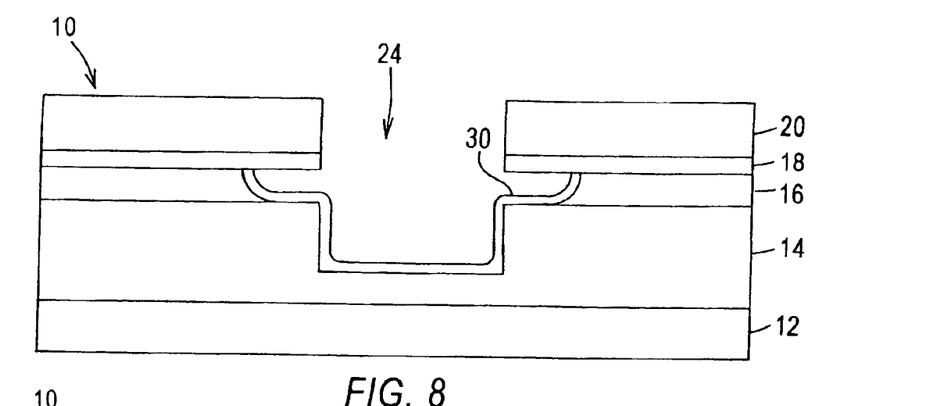

After enlarging the trench 24, the photoresist 22 is stripped, such as by a solvent or by ashing, and a liner oxide layer 30 is formed, as shown in FIG. 8. A liner oxide layer 30 is a thermal oxide liner grown to a thickness of about 30 Å to about 100 Å. The thermal oxide liner layer 30 is grown by conventional methods, such as by exposing the semiconductor substrate 10 to an oxygen ambient at a temperature of approximately 950° C. to about 1100° C.

Figure 9:
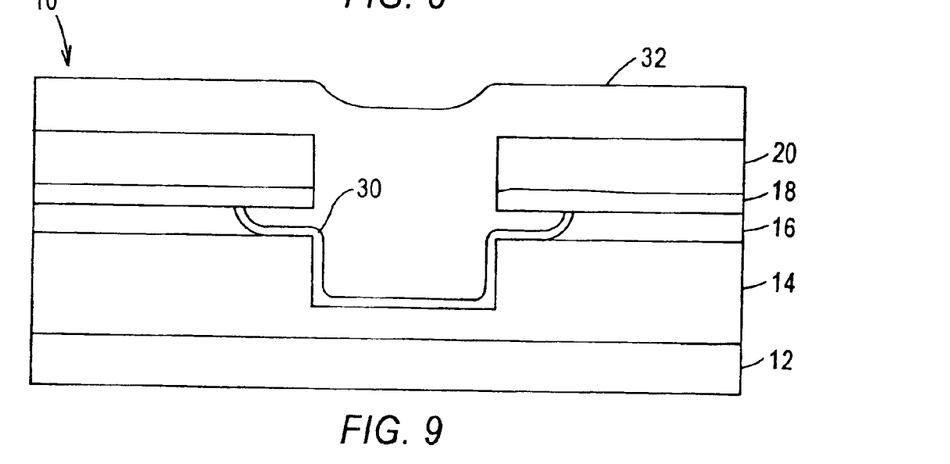

The trench 24 is subsequently filled with a suitable insulating material 32 by a conventional CVD process, as shown in FIG. 9. Suitable insulating materials 32 include silicon nitride and silicon oxide. Typically, the trench 24 is filled with silicon oxide 32 to form a shallow trench isolation region 66. Some of the conventional methods of filling the trench 24 include: a) tetraethylorthosilicate low pressure chemical vapor deposition (TEOS LPCVD), b) non-surface sensitive TEOS ozone atmospheric or sub-atmospheric pressure chemical vapor deposition (APCVD or SACVD), and c) silane oxidation high-density plasma CVD. The trench filling insulating material fills the undercut 54 of the oxide layer 18.

Figure 10:
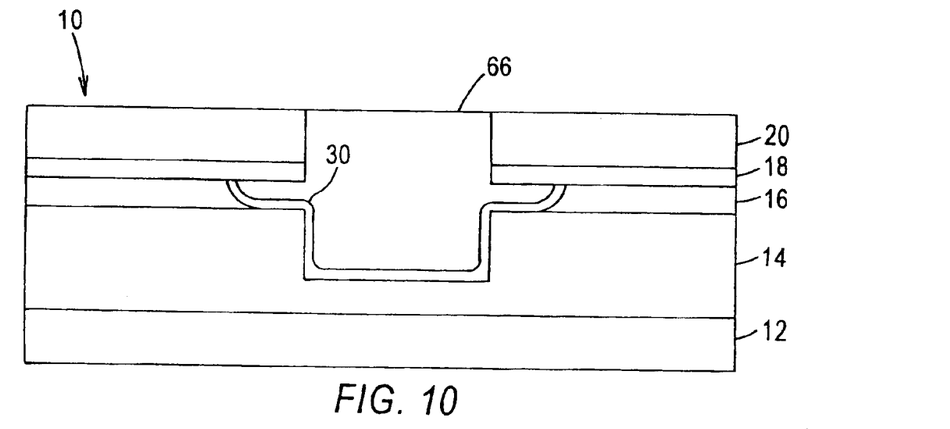
Figure 11:
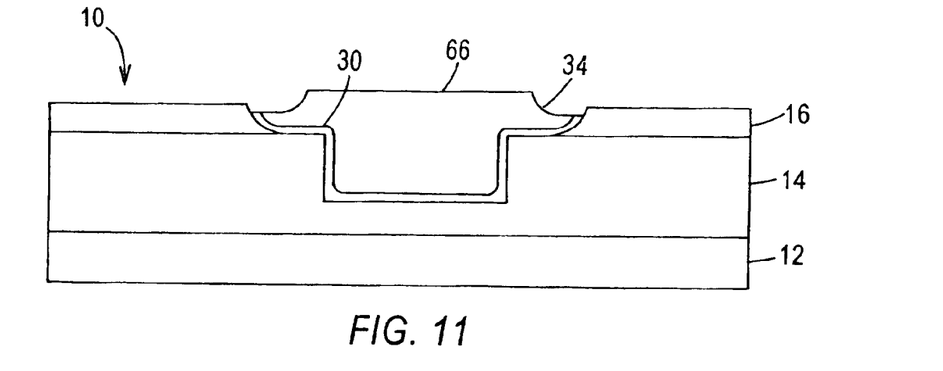

After filling the trench 24 with insulating material 32 the semiconductor device 10 is planarized via chemical-mechanical polishing (CMP), as shown in FIG. 10. After planarizing, nitride layer 20 and oxide layer 18 are subsequently removed, as shown in FIG. 11. Nitride layer 20 and oxide layer 18 are typically removed by wet etching. Hot phosphoric acid is conventionally used to etch silicon nitride and hydrofluoric acid or a mixture of hydrofluoric acid and ammonium fluoride (buffered oxide etch) is used to remove the oxide layer 18. If the insulating material filling the trench 32 is an oxide, the etchant used to remove the oxide layer 18 also slightly etches the oxide material filling the trench 32 forming a recess 34 in the shallow trench isolation region 66.

Figure 12:
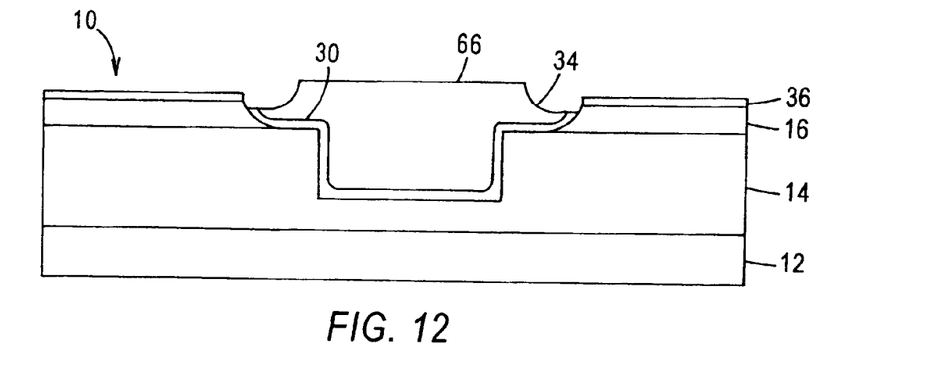
Figure 13:
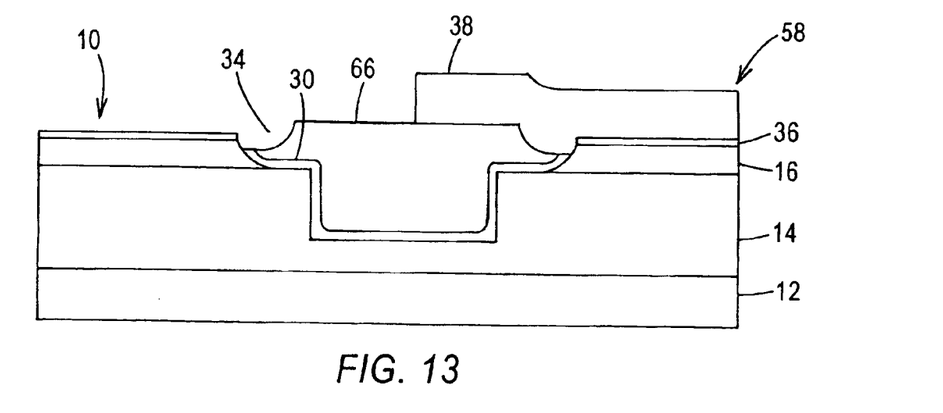

After shallow trench isolation regions 66 are formed, a transistor 56 is formed. A gate oxide layer 36 is formed, as shown in FIG. 12. The gate oxide 36 can be formed over selected portions of the semiconductor device 10 by conventional photolithographic masking techniques. The gate oxide layer 36 is formed to a thickness of about 10 Å to about 100 Å by either CVD or by thermal oxidation of a portion of the strained silicon layer 16. As shown in FIG. 13, a gate electrode layer 38 is subsequently formed by depositing polysilicon to a thickness of about 100 nm to about 300 nm. The semiconductor device 10 is subsequently masked and patterned, such as by conventional photolithographic patterning, and the gate oxide layer 36 and gate electrode layer 38 are etched to form gate electrode structure 56, as shown in FIG. 13.

Figure 14:
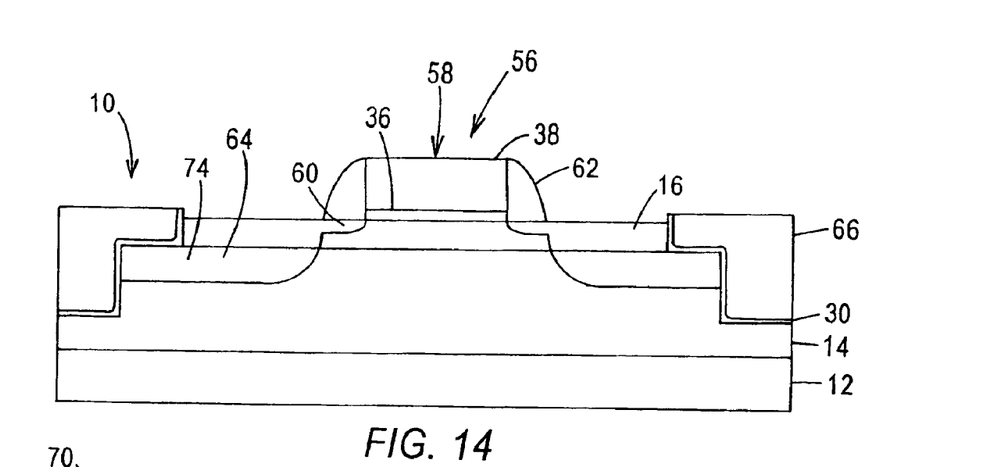

Ion implantation is used to form source/drain extensions 60, as shown in FIG. 14, taken along line BB of FIG. 2. Sidewall spacers 62 are subsequently formed on the gate electrode structures 58 by depositing a layer of insulating material, such as silicon nitride or silicon oxide followed by anisotropic etching to form the sidewall spacers 62. Source/drain regions 64 are subsequently formed by conventional techniques such as ion implantation, and then annealed to form the source/drain regions 64 with lightly doped drain extensions 60 and heavily doped regions 74, as shown in FIG. 14.

In the above-described semiconductor device, the transistor 56 is formed after the formation of the isolation regions 66. However, the transistor 56 may be formed prior to the formation of the isolation regions 66 in a similar manner as described.

Figure 15:
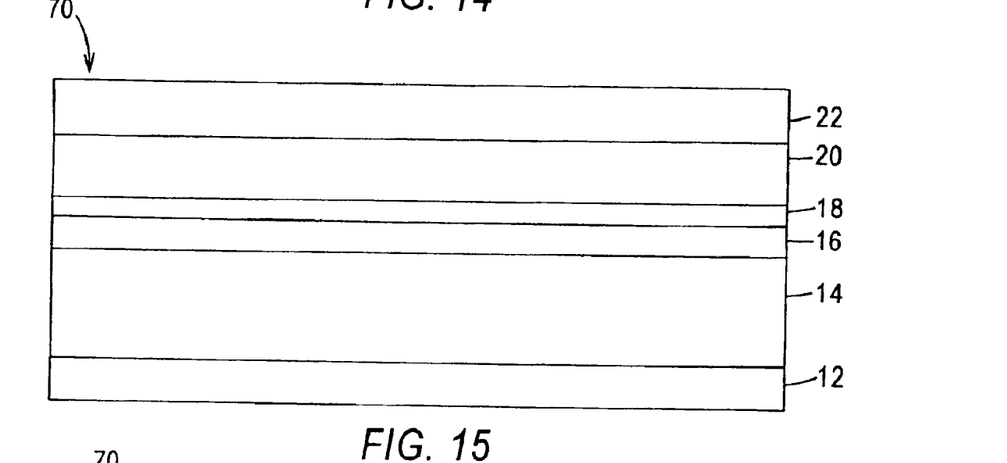
FIGS. 15-25 schematically illustrate a method of forming a semiconductor device comprising a strained silicon region and a STI region that laterally extends into the strained silicon layer according to another embodiment of the invention.

In accordance with another embodiment of the instant invention, a semiconductor device 70 is formed via the following steps. FIG. 15-25 are sectional views taken along line AA of FIG. 2 showing the formation of the semiconductor device 70. Where the features of this embodiment are the same as the first embodiment the same reference numbers are used. As shown in FIG. 15, a semiconductor substrate 12, such as a silicon-containing wafer is provided with a SiGe layer 14 formed thereon. A layer of strained silicon 16 is formed over the SiGe layer 14. A silicon oxide layer 18 and a silicon nitride layer 20 are subsequently formed over the strained silicon layer 16. A resist layer 22 comprising a conventional photoresist is formed over the nitride layer 22.

Figure 16:
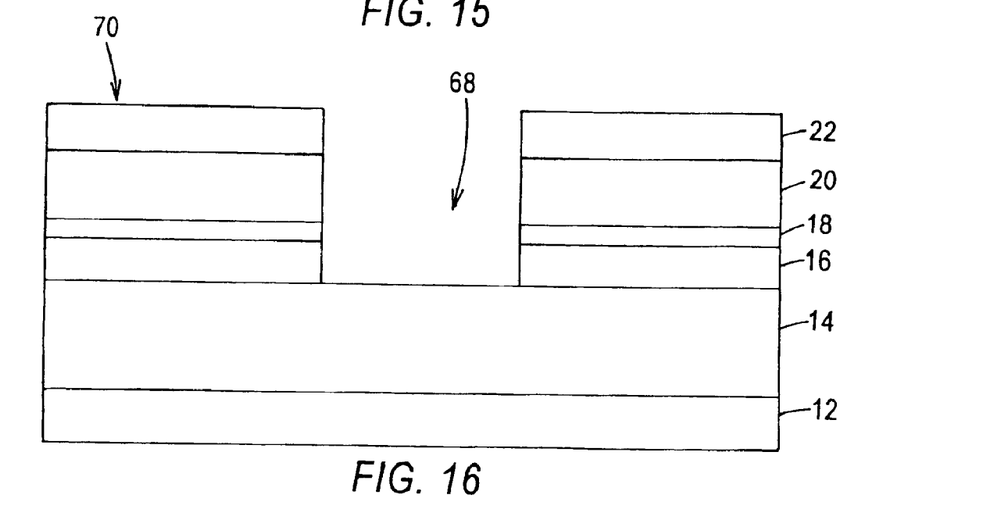
Figure 17:
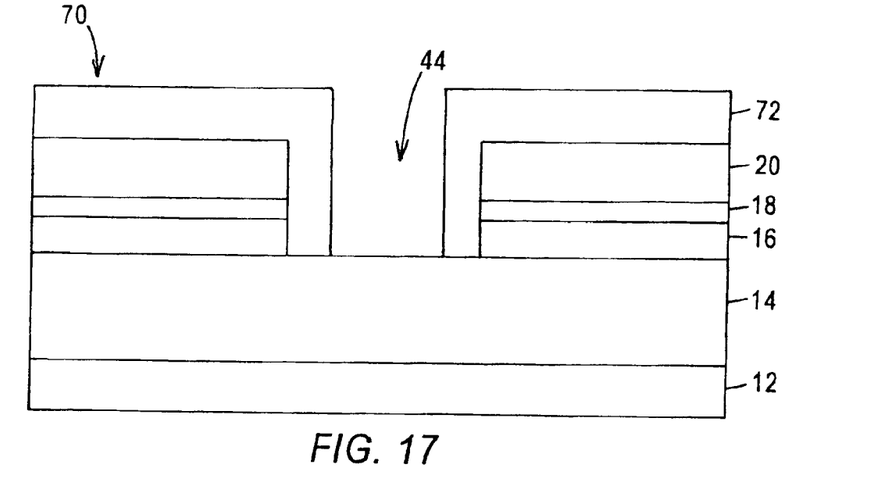

The photoresist layer 22 is patterned using conventional photolithographic techniques, such as selective exposure to actinic radiation and subsequent development. An anisotropic etch, such as a plasma etch, is performed to transfer the pattern in the photoresist into the nitride layer 20, the oxide layer 18, and the strained silicon layer 16, to form trench 68, as shown in FIG. 16. The photoresist layer 22 is subsequently removed, such as by a chemical stripping or ashing. A second resist layer 72 is deposited over the semiconductor device 70, and patterned via photolithographic processing to provide an opening 44 in the resist layer 72 inside the trench 68. The opening 44 in the photoresist layer 72 is smaller in width than the width of the trench 68, as shown in FIG. 17.

Figure 18:
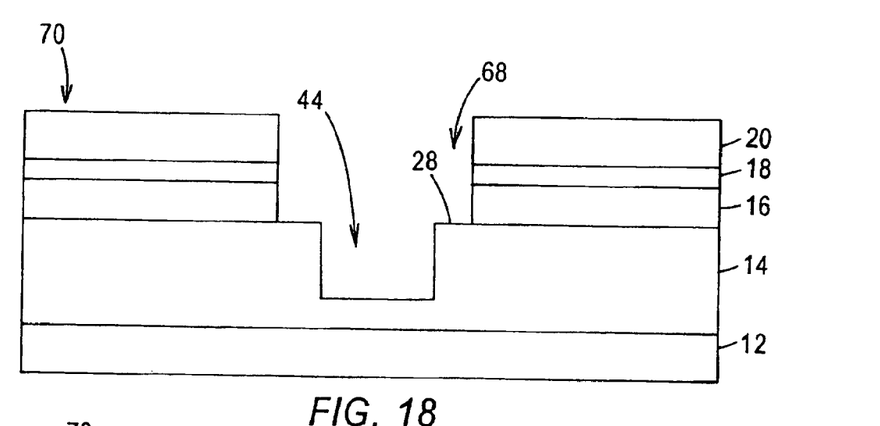
Figure 19:
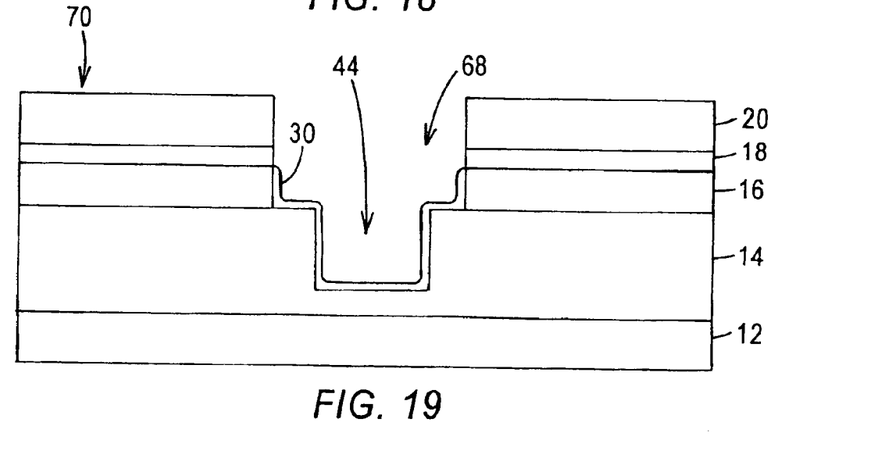

As shown in FIG. 18, the opening 44 in the photoresist layer 72 is extended into the SiGe layer 14 by an anisotropic etch to expose an edge portion of the upper surface 28 of the SiGe layer 14. After extending opening 44 into the SiGe layer 14 a predetermined distance, the photoresist layer 72 is stripped, and a liner oxide layer 30 is formed, as shown in FIG. 19.

Figure 20:
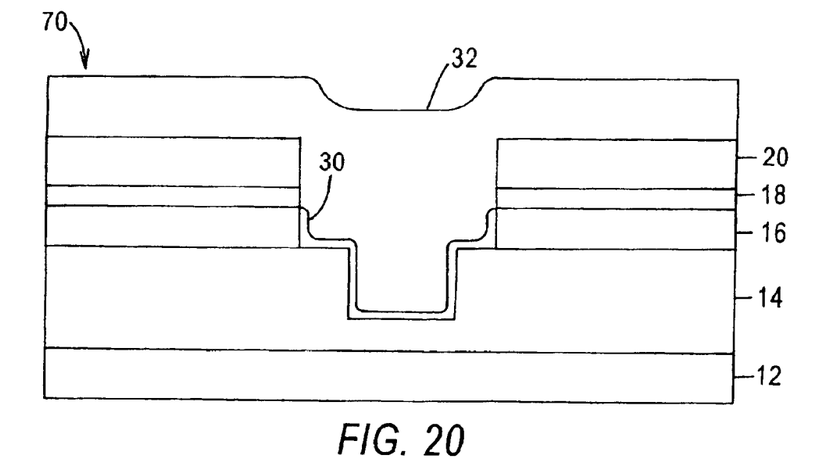
Figure 21:
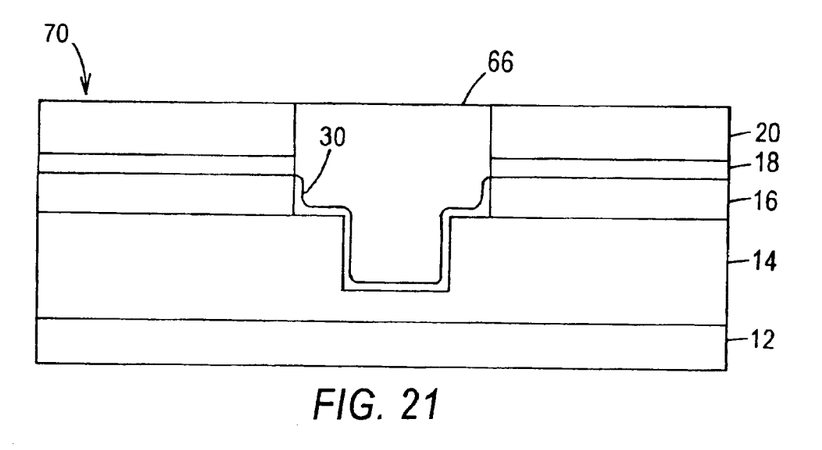
Figure 22:
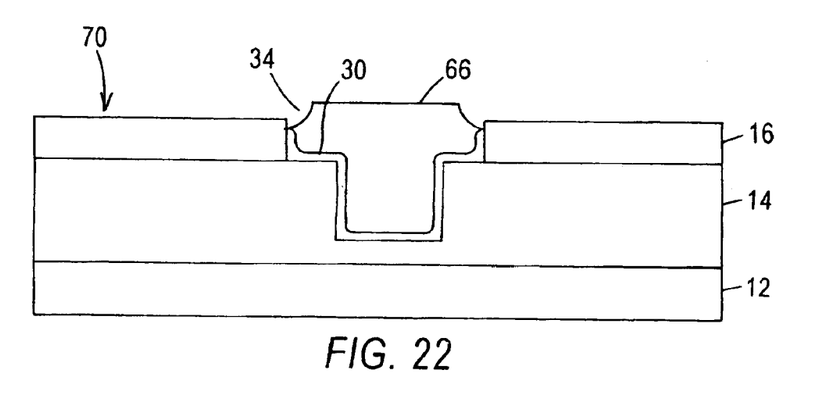

The trench 68 and the opening 44 in the SiGe layer are subsequently filled with a suitable insulating material 32 by a conventional CVD process, as shown in FIG. 20, to form a trench isolation region 66. After filling the trench 68 and the opening 44 with insulating material 32, the semiconductor device 70 is planarized via CMP, as shown in FIG. 21. After planarizing, the nitride layer 20 and the oxide layer 18 are subsequently removed, as shown in FIG. 22. If the insulating material filling the trench 32 is an oxide, the etchant used to remove the oxide layer 18 also slightly etches the oxide material filling the trench 32 forming a recess 34 in the shallow trench isolation region 66.

Figure 23:
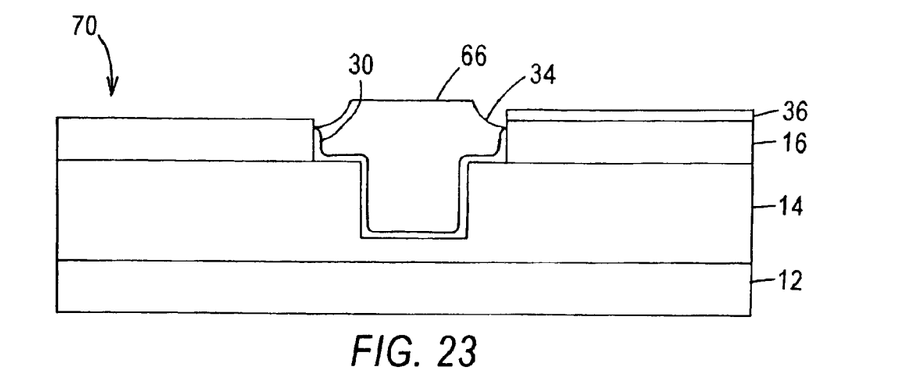
Figure 24:
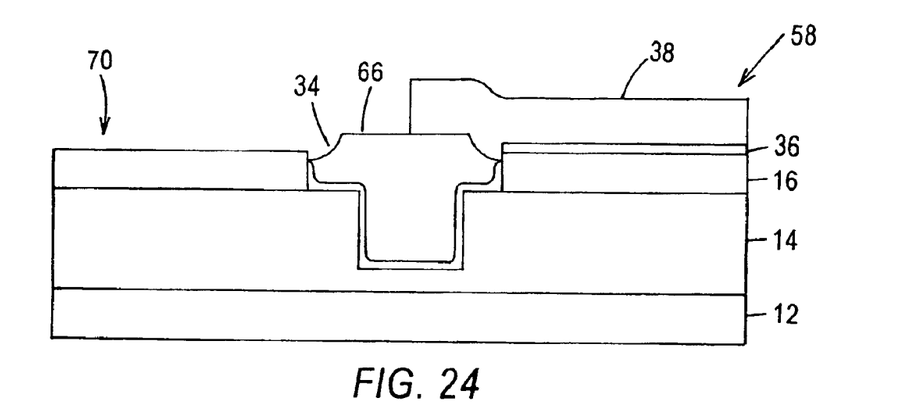

After the shallow trench isolation region 66 is formed, a transistor 56 is formed. Gate oxide layer 36 is formed, as shown in FIG. 23. As shown in FIG. 23, a gate electrode layer 38 is subsequently formed by depositing polysilicon. The semiconductor device 70 is subsequently masked and patterned, such as by conventional photolithographic patterning, and the gate oxide layer 36 and gate electrode layer 38 are etched to form a gate electrode structure 58, as shown in FIG. 24.

Figure 25:
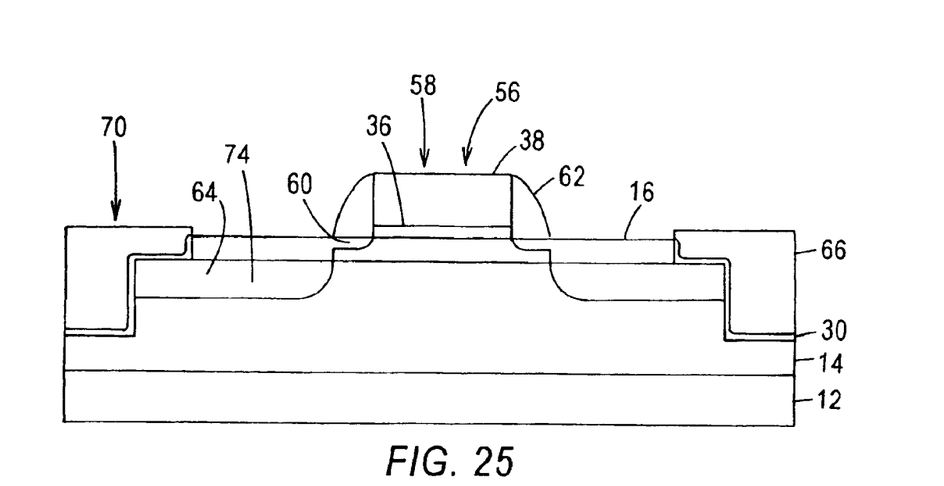

Source/drain extensions 60 are formed by ion implantation, as shown in FIG. 25, taken along line BB of FIG. 2. Sidewall spacers 62 are subsequently formed on the gate electrode structures 58 by depositing a layer of insulating material, such as silicon nitride or silicon oxide followed by anisotropic etching to form the sidewalls 62. Source/drain regions 64 are subsequently formed by conventional techniques such as ion implantation, and then annealed to form the source/drain regions 64 with lightly doped drain extensions 60 and heavily doped regions 74, as shown in FIG. 25.

The embodiments illustrated in the instant disclosure are for illustrative purposes only. They should not be construed to limit the claims. As is clear to one of ordinary skill in the art, the instant disclosure encompasses a wide variety of embodiments not specifically illustrated herein.

What is claimed is:

1. A method of forming a semiconductor device comprising:

forming a SiGe layer on a silicon-containing semiconductor substrate;

forming a silicon layer over the SiGe layer;

forming a trench of a first width in the silicon layer exposing the SiGe layer;

forming an opening in the SiGe layer in said trench, wherein the opening has a second width that is less than said first width;

filling said opening and said trench with an insulating material to form an isolation region.

2. The method according to claim 1, further comprising forming a first insulating layer and a second insulating layer over said silicon layer.

3. The method according to claim 2, further comprising forming the trench in said first and second insulating layers.

4. The method according to claim 3, wherein the trench formed in said first and second insulating layers and said silicon layer is formed by anisotropic etching.

5. The method according to claim 1, wherein said opening in said SiGe layer is formed by photolithographic patterning.

6. The method according to claim 5, wherein said step of photolithographic patterning comprises:

forming a photoresist layer over the silicon layer:

selectively exposing the photoresist layer to actinic radiation;

developing said photoresist to expose a portion of the SiGe layer in said trench, wherein the width of the exposed portion of the SiGe layer is smaller than the width of said trench;

anisotropically etching the SiGe layer to form an opening in the SiGe layer; and removing the photoresist layer.

7. The method according to claim 6, further comprising removing the photoresist layer after forming the opening in the SiGe layer.

8. The method according to claim 1, further comprising:

forming source and drain regions in the silicon layer;

forming a gate oxide layer over the silicon layer;

forming a gate electrode layer over the gate oxide layer; and patterning the gate oxide layer and gate electrode layer to form a gate electrode structure.

9. The method according to claim 1, wherein the silicon layer is a strained silicon layer.

10. The method according to claim 1, wherein the first width is about 100 Å to about 2000 Å greater than the second width.

11. The method according to claim 1, wherein the silicon layer is formed to a thickness of from about 100 Å to about 300 Å.

12. The method according to claim 1, wherein the amount of Ge in the SiGe layer ranges from about 15 atomic % to about 30 atomic % Ge.

13. The method according to claim 1, further comprising planarizing the semiconductor device subsequent to said step of filling said opening and said trench with an insulating material.

* * * * *